(12) United States Patent
Shishido et al.

(10) Patent No.: US 9,852,881 B2
(45) Date of Patent: Dec. 26, 2017

(54) SCANNING ELECTRON MICROSCOPE SYSTEM, PATTERN MEASUREMENT METHOD USING SAME, AND SCANNING ELECTRON MICROSCOPE

(71) Applicant: Hitachi High-Technologies Corporation, Minato-ku, Tokyo (JP)

(72) Inventors: Chie Shishido, Tokyo (JP); Takuma Yamamoto, Tokyo (JP); Shinya Yamada, Tokyo (JP); Maki Tanaka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 27 days.

(21) Appl. No.: 15/039,527

(22) PCT Filed: Nov. 19, 2014

(86) PCT No.: PCT/JP2014/080661
§ 371 (c)(1),
(2) Date: May 26, 2016

(87) PCT Pub. No.: WO2015/083548
PCT Pub. Date: Jun. 11, 2015

(65) Prior Publication Data
US 2016/0379798 A1    Dec. 29, 2016

(30) Foreign Application Priority Data
Dec. 2, 2013    (JP) ................................. 2013-249249

(51) Int. Cl.
*H01J 37/29*    (2006.01)
*H01J 37/26*    (2006.01)
(Continued)

(52) U.S. Cl.
CPC .............. *H01J 37/29* (2013.01); *G01B 15/00* (2013.01); *G01B 15/04* (2013.01); *H01J 37/244* (2013.01);
(Continued)

(58) Field of Classification Search
USPC .... 250/306, 307, 310, 311, 398, 399, 492.1, 250/492.3, 526
See application file for complete search history.

(56) References Cited

U.S. PATENT DOCUMENTS 5,412,210 A * 5/1995 Todokoro ............... G01B 15/04
                                                                    250/306
2013/0245989 A1* 9/2013 Kadowaki ............. H01J 37/261
                                                                    702/150
(Continued)

FOREIGN PATENT DOCUMENTS

JP    4-149944 A    5/1992
JP    6-310075 A    11/1994
(Continued)

OTHER PUBLICATIONS

International Search Report (PCT/ISA/210) issued in PCT Application No. PCT/JP2014/080661 dated Mar. 3, 2015 with English translation (Four (4) pages).
(Continued)

*Primary Examiner* — Bernard Souw
(74) *Attorney, Agent, or Firm* — Crowell & Moring LLP

(57) ABSTRACT

In order to allow detecting backscattered electrons (BSEs) generated from the bottom of a hole for determining whether a hole with a super high aspect ratio is opened or for inspecting and measuring the ratio of the top diameter to the bottom diameter of a hole, which are typified in 3D-NAND processes of opening a hole, a primary electron beam accelerated at a high accelerating voltage is applied to a
(Continued)

sample. Backscattered electrons (BSEs) at a low angle (e.g. a zenith angle of five degrees or more) are detected. Thus, the bottom of a hole is observed using "penetrating BSEs" having been emitted from the bottom of the hole and penetrated the side wall. Using the characteristics in which a penetrating distance is relatively prolonged through a deep hole and the amount of penetrating BSEs is decreased to cause a dark image, a calibration curve expressing the relationship between a hole depth and the brightness is given to measure the hole depth.

25 Claims, 18 Drawing Sheets

(51) Int. Cl.
| | | |
|---|---|---|
| *G01B 15/00* | (2006.01) | |
| *G01B 21/00* | (2006.01) | |
| *H01J 37/244* | (2006.01) | |
| *H01J 37/28* | (2006.01) | |
| *G01B 15/04* | (2006.01) | |
| *H01L 21/66* | (2006.01) | |

(52) U.S. Cl.
CPC .......... *H01J 37/28* (2013.01); *G01B 2210/56* (2013.01); *H01J 2237/2448* (2013.01); *H01J 2237/24475* (2013.01); *H01J 2237/24495* (2013.01); *H01J 2237/281* (2013.01); *H01J 2237/2806* (2013.01); *H01J 2237/2815* (2013.01); *H01L 22/12* (2013.01)

(56) References Cited

U.S. PATENT DOCUMENTS

| | | | |
|---|---|---|---|
| 2014/0217274 A1* | 8/2014 | Wang | H01J 37/263 |
| | | | 250/252.1 |
| 2014/0299769 A1* | 10/2014 | Okai | H01J 37/28 |
| | | | 250/310 |

FOREIGN PATENT DOCUMENTS

| | | | |
|---|---|---|---|
| JP | 2002-110079 A | | 4/2002 |
| JP | 2003-157790 A | | 5/2003 |
| JP | 2010-175249 A | | 8/2010 |
| JP | 2013-45500 A | | 3/2013 |
| JP | 2013-89514 A | | 5/2013 |
| JP | 2013-134879 A | | 7/2013 |

OTHER PUBLICATIONS

Japanese-language Written Opinion (PCT/ISA/237) issued in PCT Application No. PCT/JP2014/080661 dated Mar. 3, 2015 (Six (6) pages).

* cited by examiner

F I G. 1A
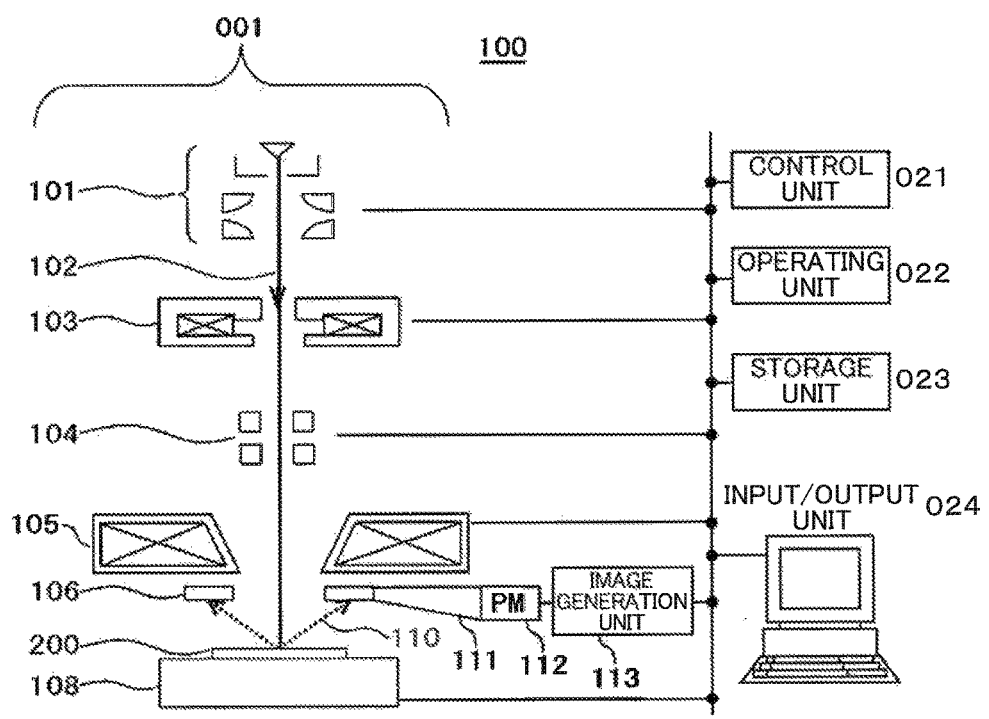
F I G. 1B
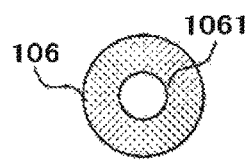

F I G. 7A
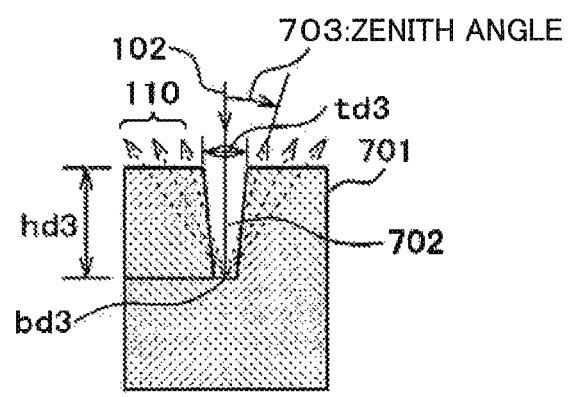
F I G. 7B
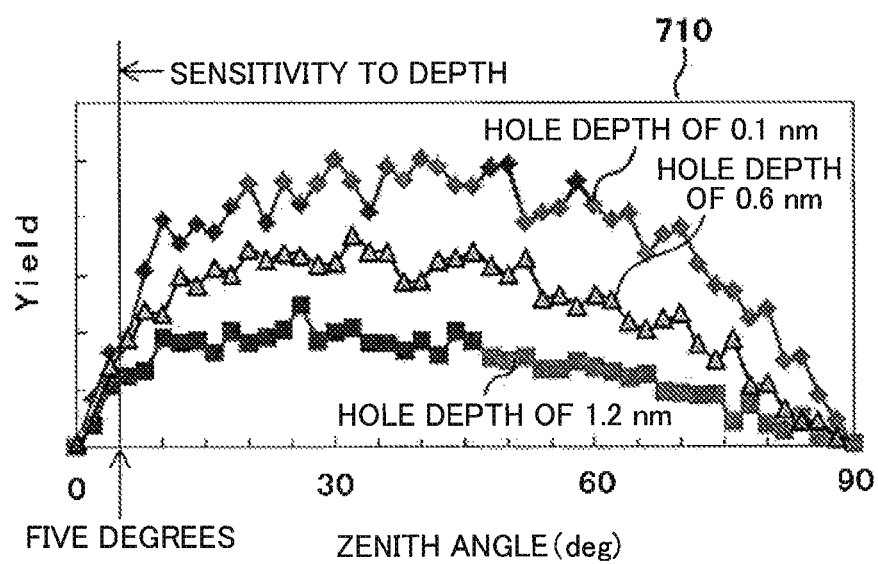

☐ CORRECT DEPTH
▒ SLIGHTLY SHALLOW
■ VERY SHALLOW

F I G. 1 2 A
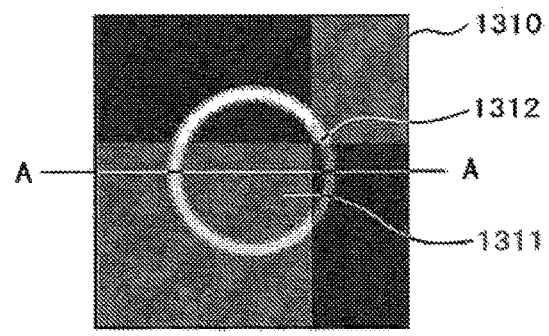
F I G. 1 2 B
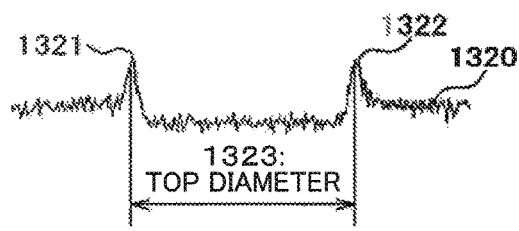
F I G. 1 2 C
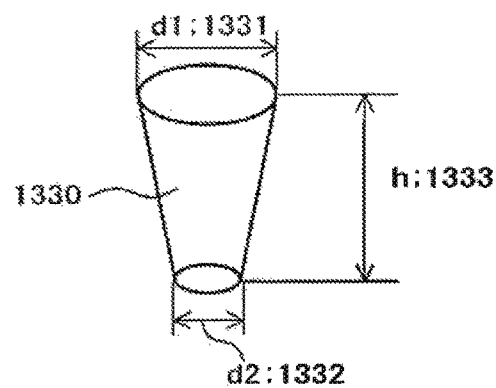

F I G. 1 3 A
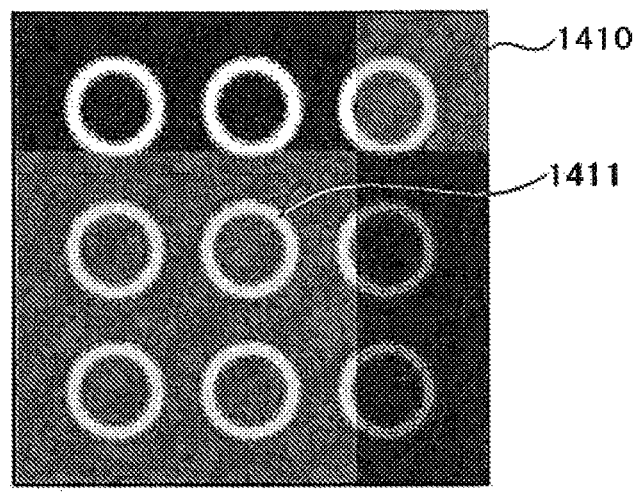
F I G. 1 3 B
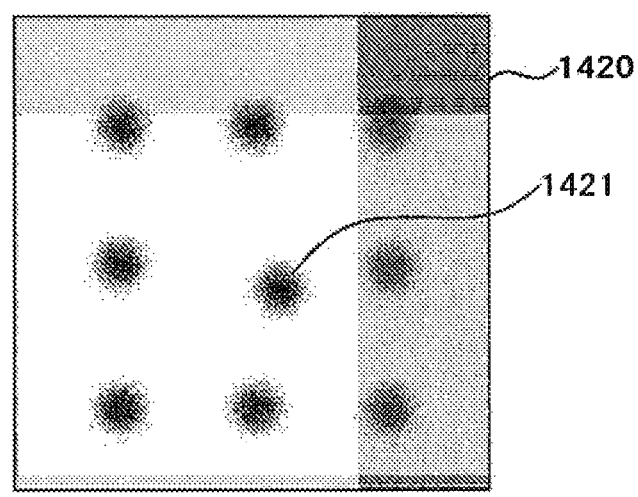

F I G. 1 4 A
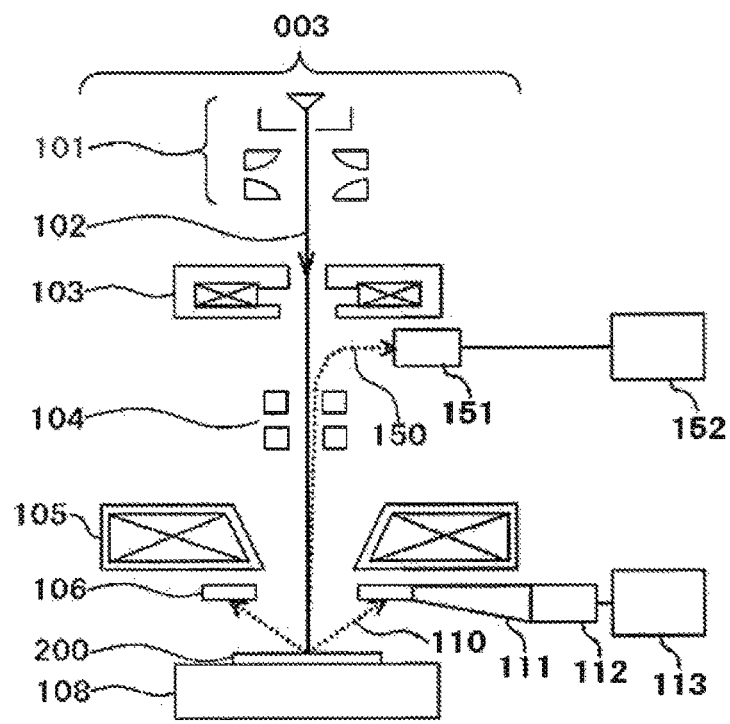
F I G. 1 4 B
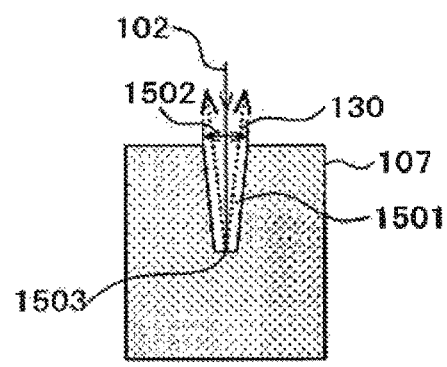

F I G. 1 8 A
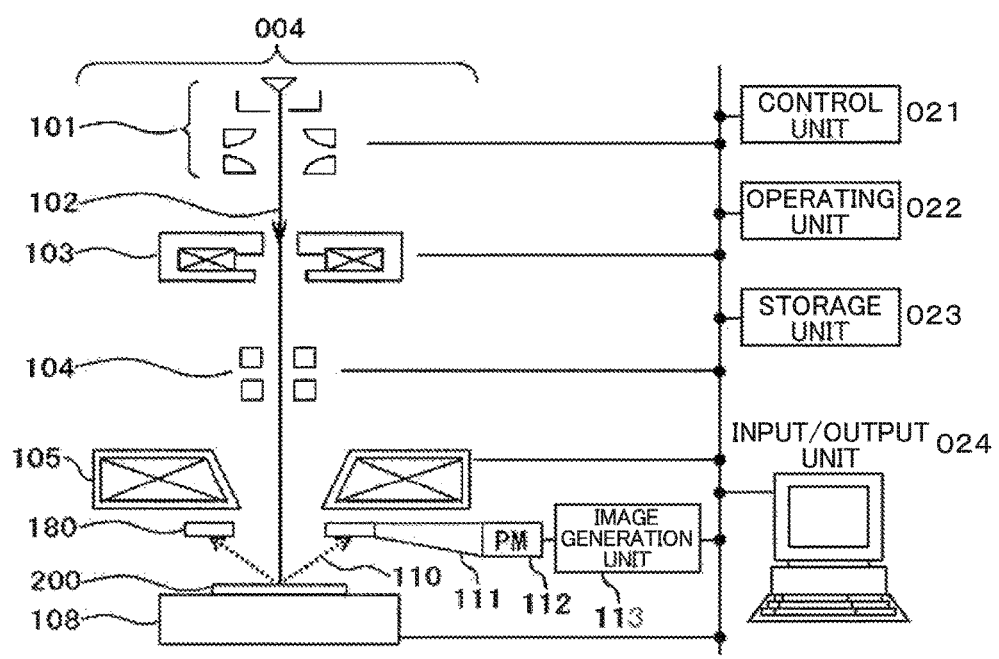
F I G. 1 8 B
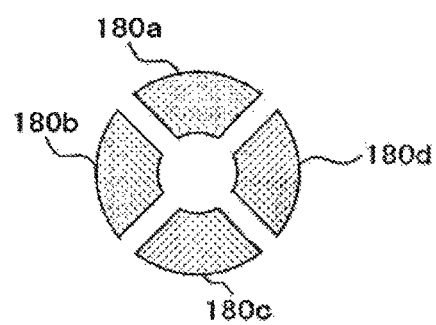

SCANNING ELECTRON MICROSCOPE SYSTEM, PATTERN MEASUREMENT METHOD USING SAME, AND SCANNING ELECTRON MICROSCOPE

TECHNICAL FIELD

The present invention relates to a dimension measurement method for patterns formed on a semiconductor wafer, and more specifically to a scanning electron microscope system for dimension measurement of hole patterns and groove patterns with a high aspect ratio, a pattern measurement method using the same, and a scanning electron microscope.

BACKGROUND ART

For pattern dimension management in semiconductor manufacturing processes, a critical dimension scanning electron microscope (SEM) is widely used, in which an SEM is specialized only to semiconductors. FIG. 2A is the basic configuration of a previously existing critical dimension SEM. A primary electron beam 102 emitted from an electron gun 101 is narrowly focused at a capacitor lens 103, and two-dimensionally scanned over a sample 107 by a deflector 104. Typically, a relatively low accelerating voltage of about one kV is used for an accelerating voltage. Secondary electrons 120 generated from the sample 107 by applying the electron beam are captured at a detector 121, and thus a secondary electron beam image is obtained. On the secondary electron beam image, pattern edges are bright on the image due to a tilt angle effect or edge effect. Thus, the locations of the edges are detected by image processing methods to determine dimensions.

Reductions in the costs of semiconductor devices are achieved by decreasing chip areas by downscaling. However, increases in manufacturing costs such as lithography cancel the merits of the costs obtained by decreasing chip areas. In NAND flash memories, which are new schemes for cost reductions, the development of a technique (3D-NAND) is accelerating, in which memory cell arrays are stacked to form a three-dimensional memory cell array.

3D-NAND is formed through process steps in which after an electrode film and an insulating film are alternately stacked, a hole penetrated from a topmost layer to a lowermost layer is opened at one time (see FIG. 3A), a memory film is formed on the side surface of the hole, and then a columnar electrode is buried. The process steps of opening a hole determine the success or failure of this process. The key point is to provide a hole that is penetrated to the lowermost layer in proper diameter. Requests are to manage whether a hole is opened or not or manage the ratio of the top diameter to the bottom diameter of a hole.

For a technique of observing whether a hole is opened or not or observing the ratio of the top diameter to the bottom diameter of a hole, Patent Literature 1, for example, describes a scanning electron microscope. The scanning electron microscope provides high energy primary electrons with energy enough to cause the primary electrons to reflect off the side wall or bottom face of a groove or hole of a sample and penetrate the inside of the sample for escaping from the surface of the sample or for generating tertiary electrons on the surface of the sample. The scanning electron microscope applies these primary electrons to the sample for observing a hole pattern having an aspect ratio of around three. Patent Literature 1 shows exemplary accelerating voltages of 100 kV and 200 kV for primary electrons.

Patent Literature 1 describes a configuration in which reflected electrons are disposed between an objective lens and a sample and detected by a scintillator, and tertiary electrons having passed through the center hollow portion of the objective lens are extracted using an extraction electric field and detected by the scintillator.

On the other hand, in Patent Literature 2, an electron beam accelerated at a voltage of 50 kV or more is applied to a sample using a scanning electron microscope, and secondary electrons or tertiary electrons generated from the sample are detected by a scintillator for observing the inside of a hole or groove. Similarly to Patent Literature 1, a configuration is described in which reflected electrons are disposed between an objective lens and a sample and are detected by a scintillator, and tertiary electrons having passed through the center hollow portion of the objective lens are extracted using an extraction electric field, and detected by the scintillator.

CITATION LIST

Patent Literature

Patent Literature 1: Japanese Unexamined Patent Application Publication No. Hei4(1992)-149944

Patent Literature 2: Japanese Unexamined Patent Application Publication No. Hei6(1994)-310075

SUMMARY OF INVENTION

Technical Problem

In order to manage the process steps of opening a hole, it is necessary to inspect and measure a hole with a considerably high aspect ratio in which the diameter of the hole is about 50 nm and the depth is 2 μm or more. However, as illustrated in FIG. 2B, a previously existing critical dimension SEM has a problem, which is that secondary electrons generated in the inside of a hole collide against the inner wall and are lost before escaping to the outside; thus, signals from the bottom of the hole are hardly obtained, and the bottom diameter of the hole, which is specifically important, fails to be measured.

According to a method described in Patent Literature 1, a configuration is described in which reflected electrons of high energy generated from the bottom of the hole are separated from tertiary electrons generated from the reflected electrons of high energy having passed the side wall of the hole using a suction electrode, and the reflected electrons and the tertiary electrons are detected. However, the level of tertiary signals generated from a sample formed with a narrow, deep hole with a large aspect ratio is typically low. Therefore, in the configuration described in Patent Literature 1 in which tertiary electrons are sucked using the suction electrode for detection, only some of tertiary electrons generated from the sample can be detected. In the case where a narrow, deep hole with a large aspect ratio is observed, it is difficult to reliably provide a sufficient level of the detection signals of tertiary electrons.

In the configuration described in Patent Literature 1 in which reflected electrons are detected using the scintillator disposed between the objective lens and the sample and tertiary electrons having passed through the center hollow portion of the objective lens are extracted using an extraction electric field and detected by the scintillator, in tertiary electrons generated from the sample, only some of tertiary electrons having passed through the center hollow portion of the objective lens can be detected, and it is difficult to reliably provide a sufficient level of detection signals of tertiary electrons. In reflected electrons generated from the bottom of a deep hole with a large aspect ratio, most of the components of reflected electrons emitted from the hole opening to the outside travel in the direction along the center axis of the hole. Thus, the scintillator disposed around the objective lens is difficult to detect tertiary electrons except tertiary electrons having passed through the center hollow portion of the objective lens. On the other hand, also in the scanning electron microscope system described in Patent Literature 2, only some of tertiary electrons generated from the sample can be detected by the disclosed scintillator, and it is difficult to reliably provide a sufficient level of the detection signals of tertiary electrons. In addition, most of the components of reflected electrons generated from the bottom of a deep hole with a large aspect ratio travel in the direction along the center axis of the hole. Thus, the scintillator disposed around the objective lens is difficult to detect tertiary electrons except tertiary electrons having passed through the center hollow portion of the objective lens.

The present invention is to solve the problems of the above-described previously existing techniques and to provide a scanning electron microscope system that can measure a hole diameter or a groove width with a high aspect ratio, a pattern measurement method using the same, and a scanning electron microscope.

Solution to Problem

In order to solve the problems, in the present invention, a scanning electron microscope system that measures a hole pattern or a groove pattern formed on a substrate is configured to include: a primary electron beam application unit that scans and applies a primary electron beam to a pattern formed on the substrate; a backscattered electron detection unit that detects backscattered electrons having penetrated a side wall of the hole pattern or the groove pattern among backscattered electrons emitted from the substrate to which a primary electron beam is applied by the primary electron beam application unit; an electron beam image generation unit that generates an electron beam image corresponding to a distribution of intensity of the backscattered electrons detected by the backscattered electron detection unit; and an image processing unit that determines a boundary region between a dark region and a bright region, the dark region being present in the bright region on the electron beam image generated by the electron beam image generation unit, and detects the determined boundary region as a location of an edge of the hole pattern or the groove pattern.

In order to solve the problems, in the present invention, a scanning electron microscope system that measures a hole pattern or a groove pattern formed on a substrate is configured to include: a primary electron beam application unit that scans and applies a primary electron beam to a pattern formed on the substrate; a backscattered electron detection unit that detects backscattered electrons having penetrated a side wall of the hole pattern or the groove pattern among backscattered electrons emitted from the substrate to which a primary electron beam is applied by the primary electron beam application unit; an electron beam image generation unit that generates an electron beam image corresponding to a distribution of intensity of the backscattered electrons detected by the backscattered electron detection unit; and a depth estimation unit that determines a boundary region between a dark region and a bright region, the dark region being present in the bright region on the electron beam image generated by the electron beam image generation unit, and estimates a depth of the hole pattern or the groove pattern from information about brightness of the dark region in the determined boundary region.

In order to solve the problems, in the present invention, a scanning electron microscope system that measures a hole pattern or a groove pattern formed on a substrate is configured to include: a primary electron beam application unit that scans and applies a primary electron beam to a pattern formed on the substrate; a backscattered electron detection unit that detects backscattered electrons having penetrated a side wall of the hole pattern or the groove pattern among backscattered electrons emitted from the substrate to which a primary electron beam is applied by the primary electron beam application unit; an electron beam image generation unit that generates an electron beam image corresponding to a distribution of intensity of the backscattered electrons detected by the backscattered electron detection unit; an image processing unit that determines a boundary region between a dark region and a bright region, the dark region being present in the bright region on the electron beam image generated by the electron beam image generation unit, and detects the determined boundary region as a location of an edge of the hole pattern or the groove pattern; and a depth estimation unit that determines a boundary region between a dark region and a bright region, the dark region being present in the bright region on the electron beam image generated by the electron beam image generation unit, and estimates a depth of the hole pattern or the groove pattern from information about brightness of the dark region in the determined boundary region.

In order to solve the problems, in the present invention, in a pattern measurement method for a hole pattern or a groove pattern formed on a substrate using a scanning electron microscope system, the method includes: scanning and applying a primary electron beam to a hole pattern or a groove pattern formed on a substrate using an electron microscope; detecting backscattered electrons having penetrated a side wall of the hole pattern or the groove pattern among backscattered electrons emitted from the substrate to which the primary electron beam is applied; generating an electron beam image corresponding to a distribution of intensity of the detected backscattered electrons; determining a boundary region between a dark region and a bright region, the dark region being present in the bright region on the generated electron beam image; and detecting the determined boundary region as a location of an edge of the hole pattern or the groove pattern, and/or estimating a depth of the hole pattern or the groove pattern from information about brightness of the dark region in the determined boundary region.

In order to solve the problems, in the present invention, an electron microscope that measures a hole pattern or a groove pattern formed on a substrate is configured to include: a primary electron beam application unit that scans and applies a primary electron beam to a pattern formed on the substrate; a backscattered electron detection unit that detects backscattered electrons having penetrated a side wall of the hole pattern or the groove pattern among backscattered electrons emitted from the substrate to which a primary electron beam is applied by the primary electron beam application unit; and an electron beam image generation unit that generates an electron beam image corresponding to a distribution of intensity of the backscattered electrons detected by the backscattered electron detection unit.

Advantageous Effects of Invention

According to the present invention, the diameter of a hole with a high aspect ratio can be measured, as well as the depth of a hole can be measured.

BRIEF DESCRIPTION OF DRAWINGS

FIG. 1A A block diagram of the configuration of a scanning electron microscope system according to a first embodiment of the present invention.

FIG. 1B A plan view of a scintillator according to the first embodiment of the present invention.

FIG. 7A A cross sectional view of schematically illustrating a sample formed with a hole pattern in a state in which backscattered electrons are generated from a hole bottom when a primary electron beam is applied to a sample formed with hole patterns.

FIG. 7B A graph of the distributions corresponding to the zenith angles of backscattered electrons generated from hole bottoms for the depths of individual holes when a primary electron beam is applied to a sample formed with hole patterns.

FIG. 12A A diagram of a secondary electron image of a hole pattern obtained when a primary electron beam is applied to the hole pattern.

FIG. 12B A signal waveform diagram of a signal waveform in a cross section taken along line A-A of the secondary electron image in FIG. 12A.

FIG. 12C A perspective view of a hole pattern according to the third embodiment in a top diameter d1, a hole depth h, and a bottom diameter d2 of the hole pattern.

FIG. 13A A schematic diagram of an SE image according to the third embodiment of the present invention.

FIG. 13B A schematic diagram of a BSE image according to the third embodiment of the present invention.

FIG. 14A A block diagram of the configuration of the imaging optical system of a scanning electron microscope system according to a fourth embodiment of the present invention.

FIG. 14B A cross sectional view of a hole pattern schematically illustrating a state in which high angle BSEs generated from the bottom of the hole pass through the hole opening and are emitted to the outside of the hole when a primary electron beam is applied to the hole pattern.

FIG. 18A A block diagram of the configuration of the imaging optical system of a scanning electron microscope system according to a sixth embodiment of the present invention.

FIG. 18B A plan view of a low angle BSE detector split in orientation directions for use in the imaging optical system of the scanning electron microscope system according to the sixth embodiment the present invention.

DESCRIPTION OF EMBODIMENTS

Figure 1C:
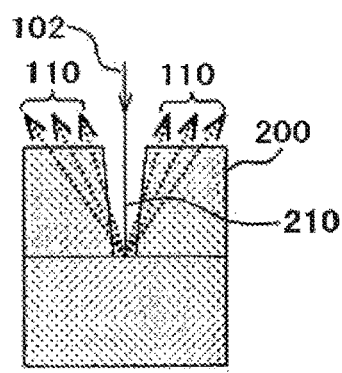
FIG. 1C A cross sectional view of a hole pattern schematically illustrating a state in which backscattered electrons (BSEs) are generated from the bottom of the hole pattern when a primary electron beam is applied to the hole pattern.

In the present invention, an electron beam at a high accelerating voltage is applied to a sample, and backscattered electrons (BSEs) at a low angle (e.g. a zenith angle of five degrees or more) are detected. Thus, the bottom of a hole is observed using "penetrating BSEs", which are emitted from the bottom of the hole and penetrate the side wall. In the present specification, the zenith angle is defined as an angle formed of the normal direction of the surface of a sample, which is a measurement target, and the emission direction of emitted electrons.

With the use of the characteristics in which a penetrating distance is relatively prolonged through a deep hole and the amount of penetrating BSEs is decreased to cause a dark image, a calibration curve expressing the relationship between the depth of a hole and the brightness is given, and the depth of the hole is measured.

In the following, embodiments will be described with reference to the drawings.

First Embodiment

FIG. 1A is the basic configuration of a scanning electron microscope system 100 to which the present invention is applied. The electron microscope system 100 is configured of an imaging optical system 001, a control unit 021, an operating unit 022, a storage unit 023, an input/output unit 024, and other components. The imaging optical system 001 generates a primary electron beam 102 at a high accelerating voltage (e.g. a voltage of 30 kV or more) from an electron gun 101, focuses the primary electron beam 102 at a capacitor lens 103, passes the primary electron beam 102 through an objective lens 105, and then focuses the primary electron beam 102 on the surface of a sample 200.

The primary electron beam 102 is two-dimensionally scanned over the sample 200 by a deflector 104. Backscattered electrons 110 in a low angle direction emitted from the sample 200 are received at an annular yttrium aluminium garnet (YAG) scintillator 106 (see FIG. 1B), and converted into optical signals. The optical signals are guided to a high electron multiplier 112 by an optical fiber 111, and a digital image is generated by an image generating unit 113. In the processes, brightness correction is typically performed in order that the image has correct brightness. The obtained image is stored on the storage unit 023. A stage 108 is moved to allow capturing images at given positions on the sample.

The control unit 021 controls voltages applied to regions around the electron gun 101, the adjustment of the focal positions of the capacitor lens 104 and the objective lens 105, the movement of the stage 108, and the operation timing of the image generating unit 113, for example. The operating unit 022 performs a dimension measurement process using the obtained image. The input/output unit 024 inputs sample information and the imaging conditions, and outputs the measured result of dimensions, for example.

With the use of the configuration as illustrated in FIG. 1A, a primary electron beam of high energy (a high accelerating voltage) is applied to the sample 200, and backscattered electrons (BSEs) of high energy are emitted from the sample 200. As illustrated in FIG. 1C, the emitted BSEs penetrate the side wall of a hole 210 formed on the sample 200, and reach the annular scintillator 106. Thus, the bottom of the hole can be observed.

Also in the case of the previously existing techniques, applying primary electrons to the bottom of a hole emits BSEs. However, the primary electrons have low energy (at a low accelerating voltage). Thus, the energy of BSEs is also low. Therefore, most of BSEs lose energy while traveling through the inside of the side wall, and fail to penetrate the side wall (see FIG. 2B).

In the present invention, a high accelerating voltage is combined with low angle BSEs (BSEs generated in the direction in which an angle formed of the normal direction on the surface of the sample 200 and the BSEs is relatively large) for allowing the observation of the bottom of a hole based on the detection principle, which is referred to as "penetrating BSEs", unlike the previously existing detection principle.

For the detection of low angle BSEs, an annular semiconductor detector or a Robinson detector may be used in addition to the YAG scintillator 106. Instead of the annular scintillator, a configuration may be possible in which detectors are disposed in multiple directions.

Figure 4A:
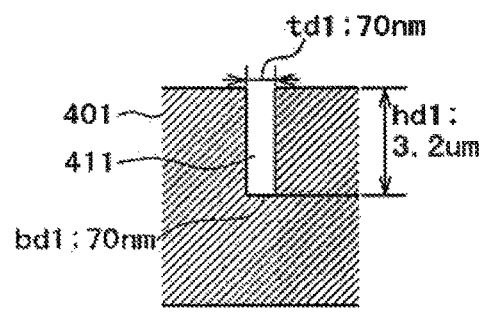
FIG. 4A A cross sectional view of a sample formed with a hole pattern in which the top diameter and the bottom diameter are formed in the same diameter.
Figure 4B:
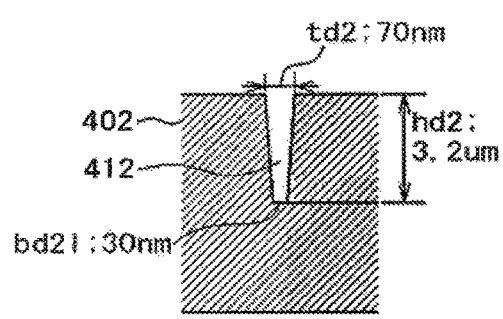
FIG. 4B A cross sectional view of a sample formed with a hole pattern in which the top diameter and the bottom diameter are formed in different diameters.

FIGS. 4A to 4D are the results confirming the effectiveness of the present invention by electron beam simulation (Monte Carlo simulation). FIG. 4A is the cross sectional topology of a hole 411 formed on a sample 401 in which a top diameter td1 is 70 nm, a bottom diameter bd1 is 70 nm, and a hole depth hd1 is 3.2 µm (in the following, referred to as a hole t70b70). FIG. 4B is the cross sectional topology of a hole 412 formed on a sample 402 in which a top diameter td2 is 70 nm, a bottom diameter bd2 is 30 nm, and a hole depth hd2 is 3.2 µm (in the following, referred to as a hole t70b30). The accelerating voltage was set to 30 kV. A secondary electron image (SE image) was obtained under the conditions in which electrons having energy of 50 eV or less were detected. A low angle BSE image was obtained under the conditions in which emitted electrons having an energy of 5,000 eV or greater at a zenith angle of 15 to 65 degrees were detected (In the present specification, the zenith angle is defined as an angle formed of the normal direction on the surface of the sample 200 and the emission direction of emitted electrons.).

Figure 4C:
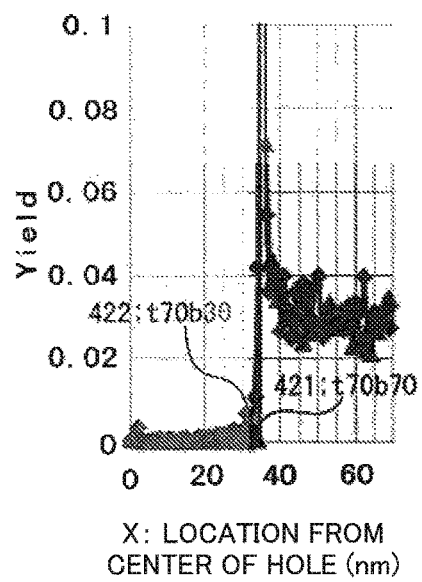
FIG. 4C A graph of a simulation result of the distribution of the detected intensity of secondary electrons (SEs) detected when a primary electron beam is applied to a sample formed with hole patterns in which the top diameter and the bottom diameter are formed in the same diameter and a sample formed with hole patterns in which the top diameter and the bottom diameter are formed in different diameters.
Figure 4D:
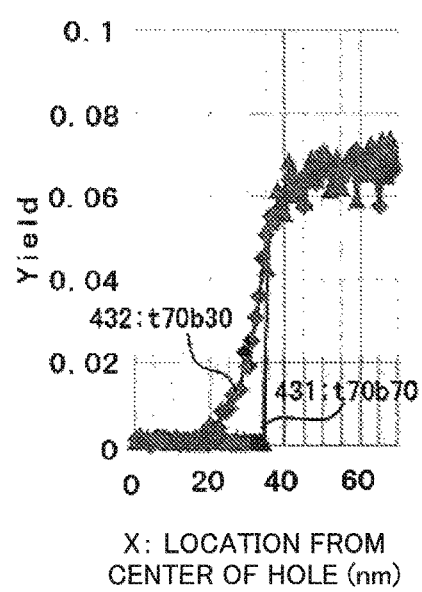
FIG. 4D A graph of a simulation result of the distribution of the detected intensity of backscattered electrons (BSEs) detected when a primary electron beam is applied to a sample formed with hole patterns in which the top diameter and the bottom diameter are formed in the same diameter and a sample formed with hole patterns in which the top diameter and the bottom diameter are formed in different diameters.

FIG. 4C is the signal waveforms of SE images detected when the primary electron beam 102 is applied to the samples 401 and 402 formed with the holes 411 and 412 having different cross sectional topologies illustrated in FIGS. 4A and 4B. FIG. 4D is the signal waveforms of low angle BSE images. The horizontal axis in each of FIGS. 4C and 4D expresses the distance from the center of the hole 411 or 412. In the hole t70b70, x=35 nm corresponds to the bottom edge of the hole. In the hole t70b30, x=15 nm corresponds to the bottom edge. The vertical axis in each of FIGS. 4C and 4D expresses the detected signal strength (Yield).

As illustrated in FIG. 4C, in the case of the SE images, in a signal waveform 421 of the SE image detected from the sample 401 formed with the hole t70b70 (the hole 411 in FIG. 4A) and a signal waveform 422 of the low angle SE image detected from the sample 402 formed with the hole t70b30 (the hole 412 in FIG. 4B), the signal strength from the bottom part of the hole is very small, and it is difficult to detect the location of the bottom edge from this signal waveform.

On the other hand, as illustrated in FIG. 4D, in the case of the low angle BSE images, the location of the rising edge of the signal waveform of a low angle BSE image 431 detected from the sample 401 formed with the hole t70b70 (the hole 411 in FIG. 4A) is located near x=35 nm, and the location of the rising edge of the signal waveform of a low angle BSE image 432 detected from the sample 402 formed with the hole t70b30 (the hole 412 in FIG. 4B) is located near x=15 nm. It is revealed that the low angle BSE images are more suitable for the detection of the location of the bottom edge of the hole than the SE images.

Figure 5A:
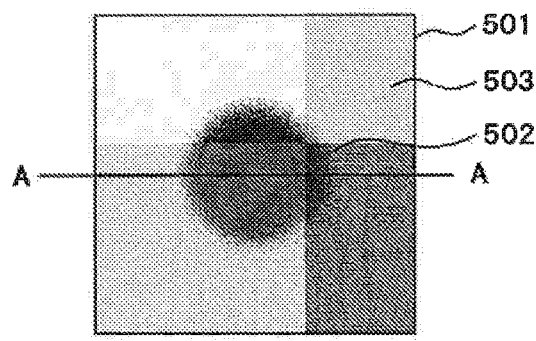
FIG. 5A is a BSE image of low angle BSEs generated from a hole pattern.
Figure 5B:
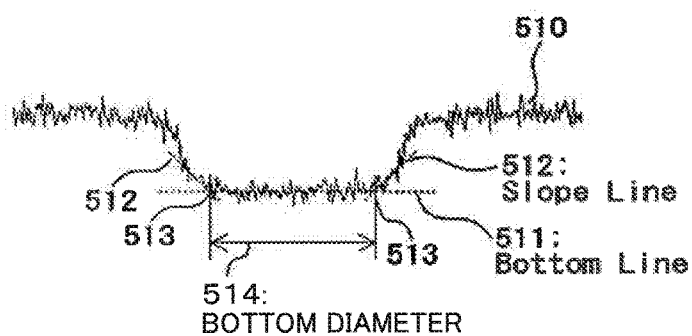
FIG. 5B A signal waveform diagram of a state in which a bottom line and a slope line are fit to a signal waveform in a cross section taken along line A-A of the low angle BSE image of the hole pattern and the bottom diameter is calculated.
Figure 5C:
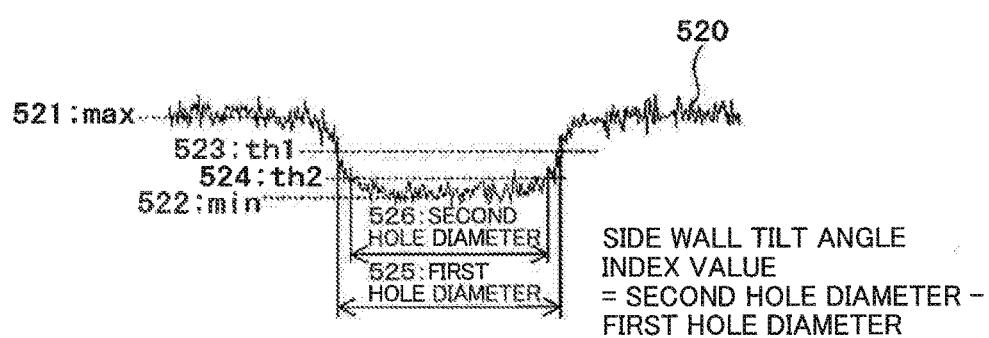
FIG. 5C A signal waveform diagram of a state in which a first threshold and a second threshold are fit to a signal waveform in a cross section taken along line A-A of the low angle BSE image of the hole pattern and a first hole diameter and a second hole diameter are calculated.

FIGS. 5A to 5C are a specific detection method for the location of the bottom edge of a hole. As illustrated in FIG. 5A, a low angle BSE image 501 of a hole pattern is an image in which a hole inner region 502 is dark and a hole outer region 503 is bright. In the case where the side wall of a hole is steep, the image has a sharp edge. In the case where the side wall of a hole is tapered, the image has a blur edge. A signal waveform 510 in FIG. 5B and a signal waveform 520 in FIG. 5C are sliced waveforms taken along line A-A crossing the hole 502 in FIG. 5A. As illustrated in FIG. 4D, the bottom edge expresses the location of the rising edge of the signal waveform. Thus, as illustrated in FIG. 5B, a bottom line 511 and a slope line 512 are fit to the bottom region and slope region of the signal waveform, respectively. Their intersection points are detected as bottom edges 513, and then a bottom diameter 514 is determined. Alternatively, as illustrated in FIG. 5C, a method may be possible in which a threshold that internally divides a maximum value 521 and a minimum value 522 of the signal waveform in a given ratio and the intersection points of the threshold with the signal waveform are edge points. In the process, a method may be possible in which a large threshold and a small threshold (th1:523 and a th2:524) are given and then a first hole diameter 525 and a second hole diameter 526 are determined. The difference between the first hole diameter 525 and the second hole diameter 526 (the first hole diameter–the second hole diameter) is taken as a side wall tilt angle index value. The sizes of the taper of the side wall can be monitored according to the sizes of the side wall tilt angle index value.

As described above, the first embodiment is the basic configuration of the present invention. According to the embodiment, the diameter of a hole with a high aspect ratio can be measured, which is not allowed to be measured by the previously existing techniques.

Second Embodiment

In this embodiment, a method is provided for measuring the diameter of a hole as well as the depth of a hole.

The present invention implements the observation of the bottom of a hole by detecting BSEs having penetrated the side wall. However, a deep hole with a large aspect ratio prolongs a distance required for electrons having been emitted from the bottom of the hole to penetrate the side wall and reach the surface. Thus, the ratio of electrons that consume energy in the midway and fail to penetrate the surface is increased. In other words, on the obtained image, the depth of a hole can be measured (estimated) using the relationship in which a deeper hole has a darker hole part.

In the following, in order to implement the measurement of the depth of a hole, necessary conditions for the configuration will be shown. The configuration of a scanning electron microscope system used in the embodiment is the same as the configuration of the scanning electron microscope system 100 described in the first embodiment and illustrated in FIG. 1A.

Figure 6A:
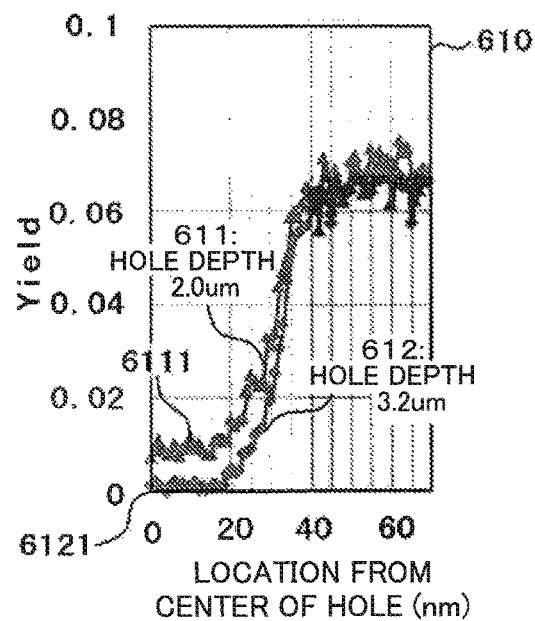
FIG. 6A A graph of the distribution of the intensity of backscattered electrons (BSEs) detected when a primary electron beam is applied to hole patterns having different depths according to a second embodiment of the present invention.

FIG. 6A is a graph 610 of the comparison of a signal waveform 611 from a hole with a depth of 2.0 µm with a signal waveform 612 from a hole with a depth of 3.2 µm on low angle BSE images. The waveforms are detected when a primary electron beam is applied to these holes formed on samples. In both of the holes, the top diameter of the hole pattern formed on the sample (corresponding to td2 in FIG. 4B) is 70 nm, and the bottom diameter (corresponding to bd2 in FIG. 4B) is 30 nm. The accelerating voltage and other conditions are the same as the conditions for the simulation described in FIGS. 4A to 4D. A signal 6111 of a signal waveform 611 is detected from BSEs emitted from the portion corresponding to the bottom of the hole in the case where the hole depth of the hole pattern (corresponding to hd2 in FIG. 4B) is 2.0 µm. A signal 6121 of a signal waveform 612 is detected from BSEs emitted from the portion corresponding to the bottom of the hole in the case where the depth of the hole is 3.2 µm. It is revealed that the signal strength of the signal 6121 is clearly smaller than the signal strength of the signal 6111. This is the characteristics greatly different from the previously existing techniques that detect SEs.

Figure 6B:
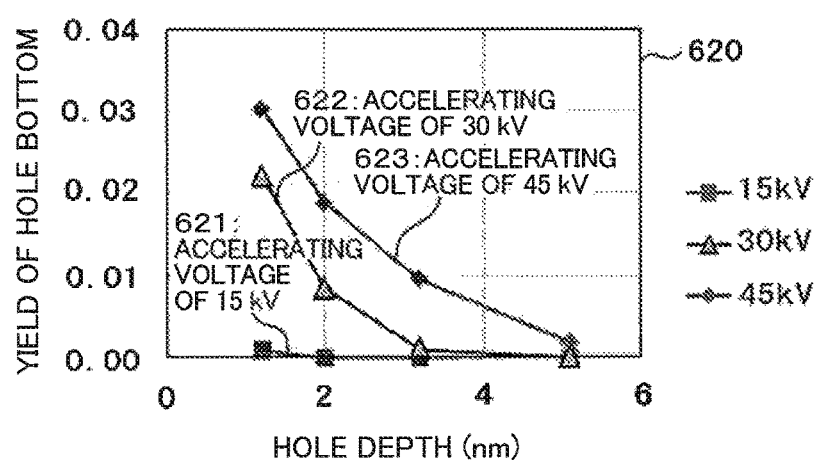
FIG. 6B A graph of plotting the relationship between the depth of a hole pattern and backscattered electrons (BSEs) generated from a hole bottom for each of the accelerating voltages of a primary electron beam according to the second embodiment of the present invention.

FIG. 6B is a graph 620 of the relationships between the hole depths of hole patterns formed on a sample and signal strengths (yields) 621, 622, and 623 of signals detected from BSEs emitted from the portion corresponding to the bottom part of the hole (corresponding to the signals 6111 and 6121 in FIG. 6A) under the conditions in which the accelerating voltages of primary electrons applied to the sample are 15 kV, 30 kV, and 45 kV. The signal strength is great when the accelerating voltage is high because BSEs have large energy and the number of electrons penetrating the side wall and reaching the topmost surface of the sample is great. In the case where the bottom of a deep hole is observed, the application of primary electrons to a sample at a high accelerating voltage is advantageous. In the case where a hole has a depth of 3 μm or more (a hole with an aspect ratio of more than 40) and a target of the present invention, the accelerating voltage of primary electrons is desirably 30 kV or more. Since the accelerating voltage in the previously existing techniques is about 1 kV, it is difficult to detect penetrating BSEs having energy that causes the BSEs to penetrate the side wall of a hole formed on a sample.

FIGS. 7A and 7B are the results of simulation performed in order to clear the range of a zenith angle (see FIG. 7A) suited to the detection of penetrating BSEs. Similarly to the cases described in FIGS. 6A and 6B, a top diameter td3 of a hole pattern formed on a sample was set to 70 nm, and a bottom diameter bd3 was set to 30 nm. A graph 710 in FIG. 7B is the distribution of the signal strength to the zenith angle in the case where a hole depth hd3 is 0.1 μm, 0.6 μm, and 1.2 μm.

In the simulation described in FIGS. 4A to 4D, the range of a zenith angle 703, in which emitted electrons are detected, is set to an angle of 15 to 65 degrees, assuming the annular scintillator 106 as illustrated in FIG. 1B. In simulation in FIGS. 7A and 7B, the entire zenith angle is detected. As illustrated in FIGS. 7A and 7B, at a zenith angle of five degrees or less, the signal strength is almost the same even though the depths of the holes are different. The reason is that emitted electrons include many electrons that have been emitted from the bottom of the hole and have escaped from the opening of the hole to the hole outer region (Changes in the signal strength caused by the depth of the hole depend on differences in the distance of electrons having passed the inside of the side wall. Thus, in the case of electrons that do not pass the side wall, no difference is observed in the signal strength caused by the depth of the hole.). For the measurement of the depth of the hole, it is revealed that low angle BSEs at a zenith angle of five degrees or more are desirably detected.

In the embodiment, the annular scintillator 106 is used for detecting BSEs, which is provided between the sample 200 and the objective lens 105 (see FIG. 1). Thus, high angle BSEs pass through a hole 1061 in the center of the scintillator 106. Therefore, high angle BSEs (having a small zenith angle 703) which have passed through the hole 1061 in the center of the scintillator 106 are not detected at the scintillator 106. Consequently, the necessary conditions are satisfied.

On the other hand, in order to reliably provide the signal amount of BSE detection signals, a wide cover range of the zenith angle for detecting BSEs using the scintillator 106 is advantageous. From the relationship between the zenith angle and the BSE signal strength illustrated in the graph 710 in FIG. 7B, desirably, at least a range of a zenith angle of 20 to 60 degrees is covered, in which the signal strength of BSE detection signals is large. In the embodiment, the necessary conditions can be satisfied by adjusting the diameter of the scintillator 106 and the distance from the scintillator 106 to the sample 200.

Figure 8A:
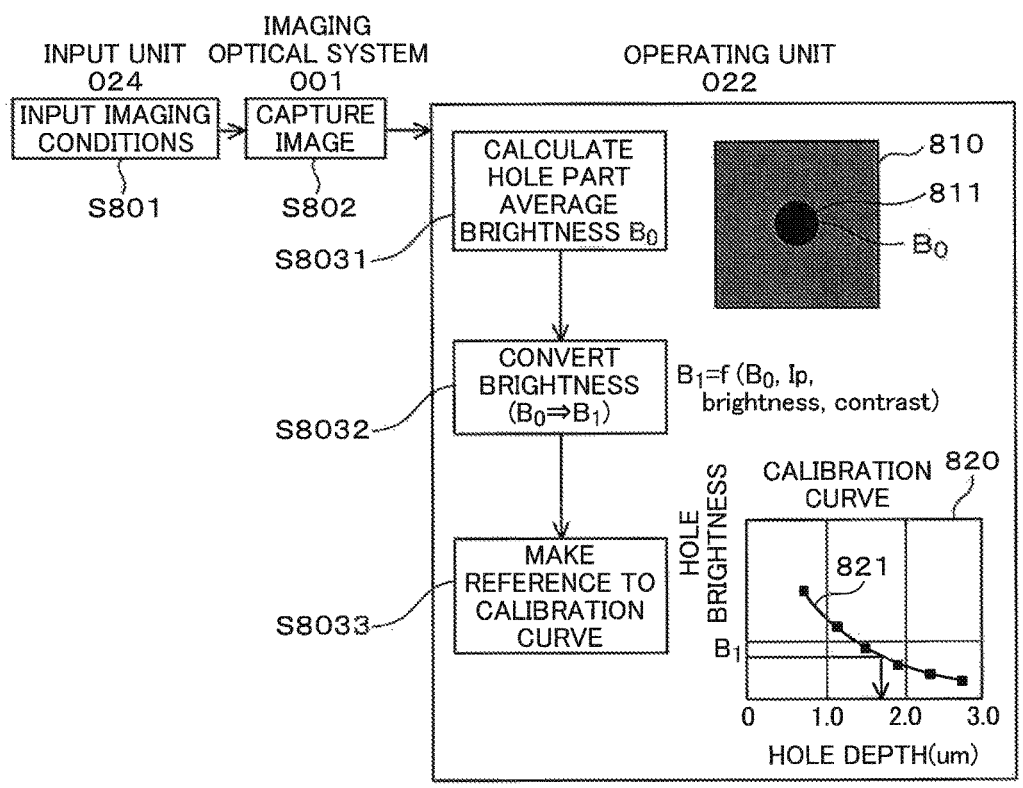
FIG. 8A A flowchart of process flows of a process in which the depth of a hole is determined based on the brightness of the image of a hole pattern according to the second embodiment of the present invention.

FIG. 8A is a flowchart of a flow of the process of measuring the depth of a hole. From the input unit 024 of the scanning electron microscope system 100 illustrated in FIG. 1A, imaging conditions, such as the imaging magnification and the accelerating voltage, are inputted (S801). Subsequently, the imaging optical system 001 acquires the image of the sample 200 based on the conditions inputted in S801 (S802). Image signals obtained by imaging the sample 200 at the imaging optical system 001 are inputted to the operating unit 022 (S803).

As illustrated in the image 810, at the operating unit 022, average brightness $B_0$ of a hole part 811 is calculated (S8031). Based on a beam current Ip in imaging and a brightness correction value (Brightness, Contrast) applied in generating the image, a transformation $B_1=f(B_0, Ip, \text{brightness, constant})$ is used, and the average brightness of the hole part 811 is converted into $B_1$ (S8032). Subsequently, reference is made to a calibration curve 821 expressing the relationship between the depth of a hole and the brightness of the hole as illustrated in a graph 820, and then the depth of the hole is determined (S8033).

Figure 8B:
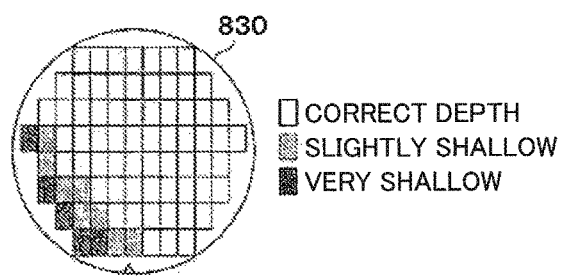
FIG. 8B A wafer map of the distribution of the depths of hole patterns in the inside of a wafer.

In S8032, the brightness of the hole is converted from $B_0$ to $B_1$. The reason is that the brightness of the hole on the image is also changed depending on the beam current value or the brightness correction value. Thus, making reference to the calibration curve has no meaning without the conversion of the brightness under the reference conditions. In other words, the calibration curve 821 is necessary to have the relationship between the depth of the hole and the brightness of the hole under the reference conditions as illustrated in a wafer map 830 in FIG. 8B.

Figure 3A:
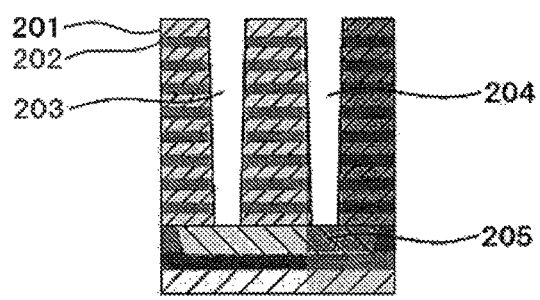
FIG. 3A A cross sectional view of a sample formed with hole patterns in a state in which holes with a high aspect ratio, which are typical measurement targets according to the first embodiment of the present invention, are correctly formed.
Figure 9A:
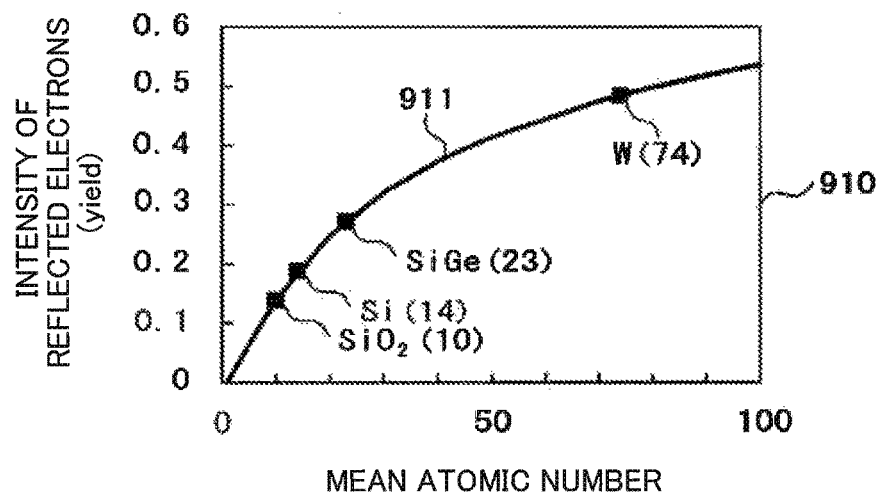
FIG. 9A A graph of the relationship between the mean atomic number and the intensity of reflected electrons according to the second embodiment of the present invention.
Figure 9B:
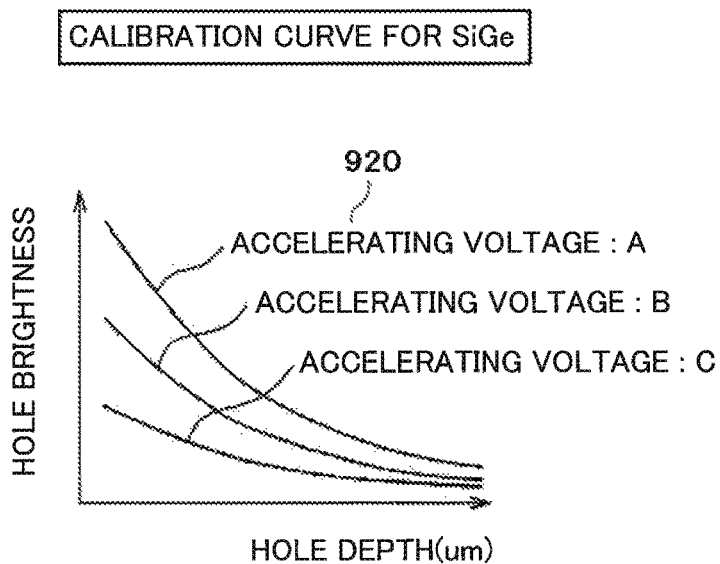
FIG. 9B A graph determined for each of the accelerating voltages of primary electron beams in the relationship between the hole depth of a hole pattern and the brightness of the hole pattern in a BSE image in the case where the material of a sample is SiGe according to the second embodiment of the present invention.
Figure 9C:
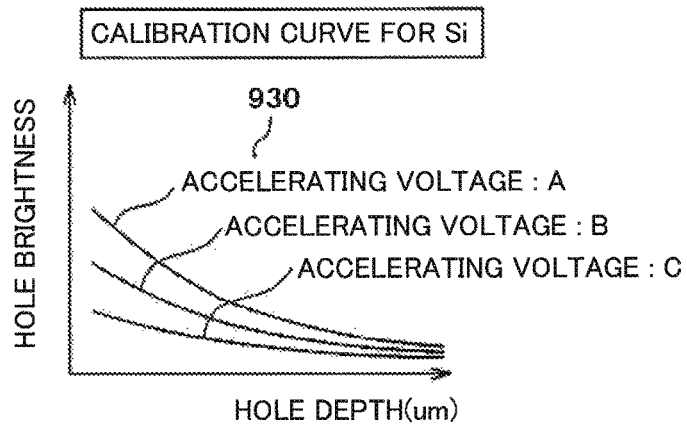
FIG. 9C A graph determined for each of the accelerating voltages of primary electron beams in the relationship between the hole depth of a hole pattern and the brightness of the hole pattern in a BSE image in the case where the material of a sample is Si according to the second embodiment of the present invention.

Referring to FIGS. 9A to 9C, the calibration curve will be additionally described. A graph 910 in FIG. 9A is an atom number dependence 911 of the intensity of reflected electrons, in the relationship in which the intensity of reflected electrons (yield) is higher as the atom number (the mean atomic number in the case of a compound) is greater. Typical materials used in semiconductor processes are plotted on the graph. The mean atomic number is written in parentheses. For example, SiO2 and Si are used for materials for film stacks (201 and 202 in FIG. 3A). SiGe is used for a stopper film (205 in FIG. 3A). The intensity of penetrating BSEs is also changed in proportion to the intensity of reflected electrons. Thus, the calibration curve is necessary to have data of accelerating voltages for individual materials. As illustrated in FIG. 6B, the intensity of penetrating BSEs is also varied depending on the accelerating voltage of the primary electron beam 102 applied to the sample 200. Therefore, as illustrated in a graph 920 in FIG. 9B and a graph 930 in FIG. 9C, the calibration curve is necessary to have data individually for materials and accelerating voltages.

Figure 10:
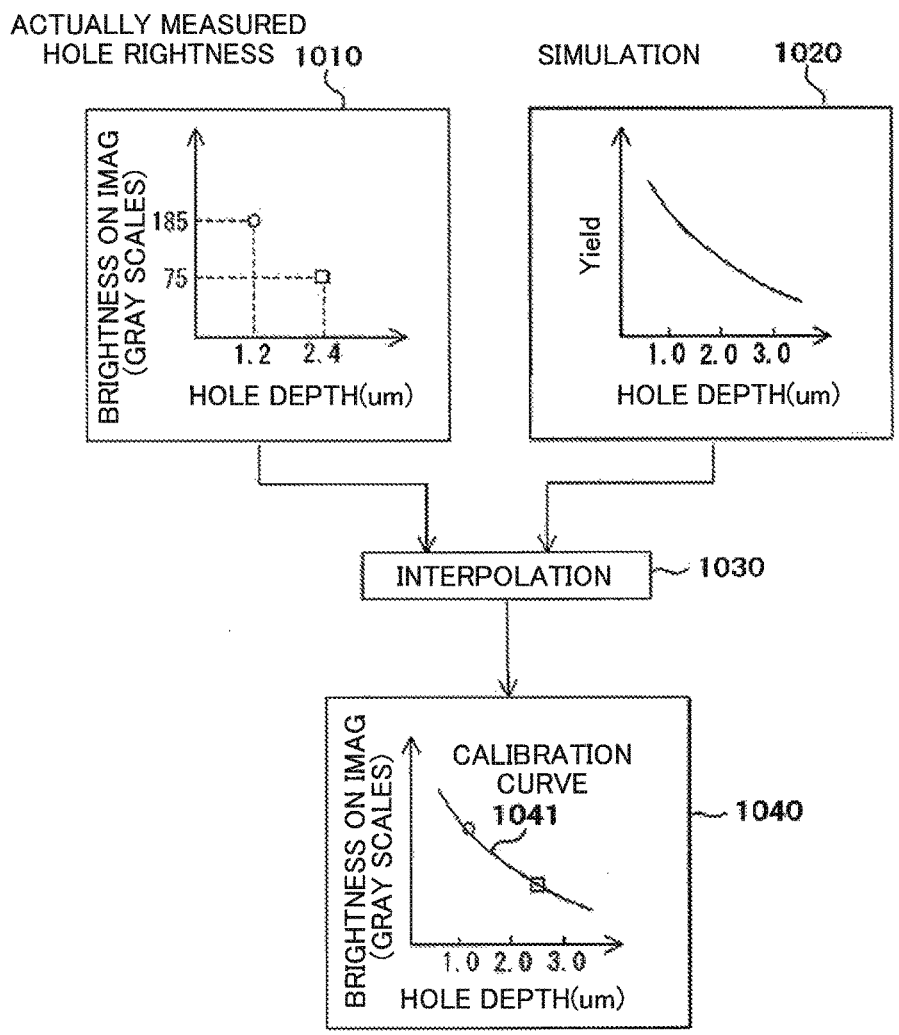
FIG. 10 A flowchart for explaining a method of creating a calibration curve expressing the relationship between the depth of a hole and the brightness according to the second embodiment of the present invention.

In the case where it is possible to generate a standard sample in which the depth of a hole is changed step by step, data for the calibration curve only has to be generated by actually measuring the brightness of the hole. However, it is sometimes difficult to generate such a standard sample. As illustrated in FIG. 10, in this case, a calibration curve 1040 may be obtained as below. One or two points in actually measured data (1010), in which the depths of holes are known, are interpolated (1030) based on a result (1020) of simulation. Such data 1041 for the calibration curve only has to be determined for each of accelerating voltages.

As described above, the basic configuration of hardware according to the second embodiment is the same as that of the first embodiment. With the use of the calibration curve expressing the relationship between the depth of a hole and the brightness of the hole with the satisfaction of the necessary conditions in which the accelerating voltage is 30 kV or more and the zenith angle is five degrees or more, the depth of the hole can be measured.

The first and the second embodiments have the same hardware configuration. Thus, the first and the second embodiments can be implemented with the same system configuration.

Third Embodiment

Figure 11A:
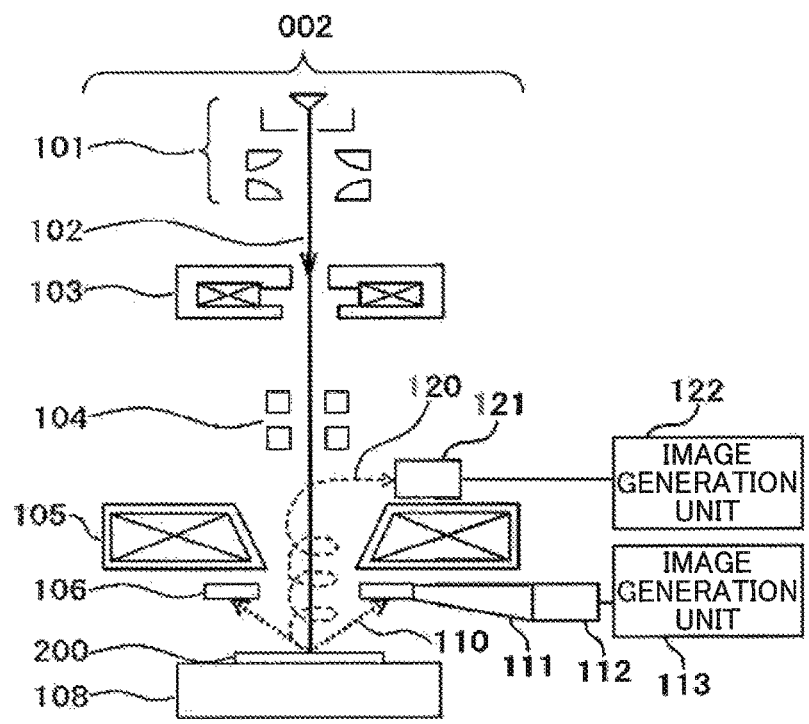
FIG. 11A A block diagram of the configuration of the imaging optical system of a scanning electron microscope system according to a third embodiment of the present invention.

FIG. 11A is the basic configuration of an imaging optical system 002 according to a third embodiment of the present invention. The difference from the imaging optical system 001 described in the first embodiment (see FIG. 1A) lies in that a detector 121 that detects secondary electrons 120 emitted from a sample 200 is additionally provided.

Figure 2A:
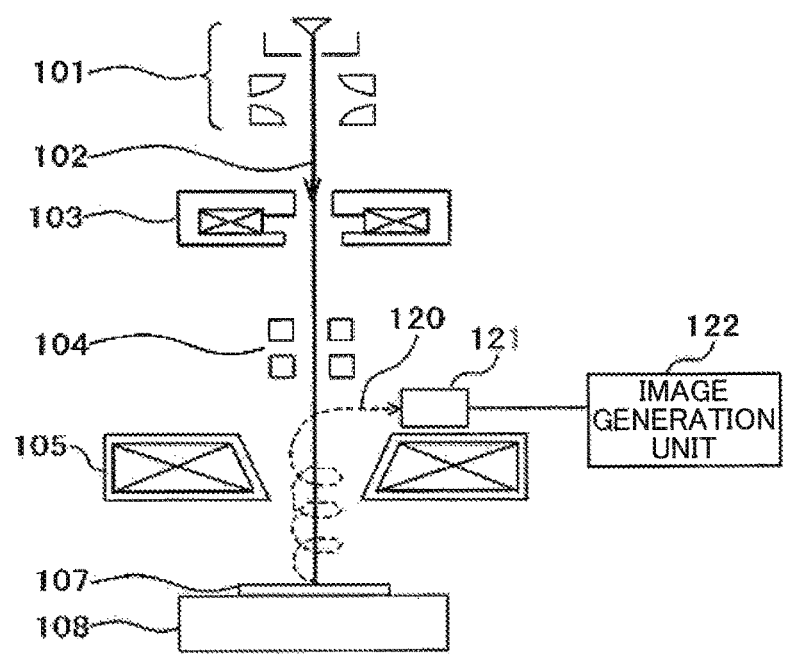
FIG. 2A A block diagram of the configuration of the imaging optical system of a previously existing scanning electron microscope system.
Figure 2B:
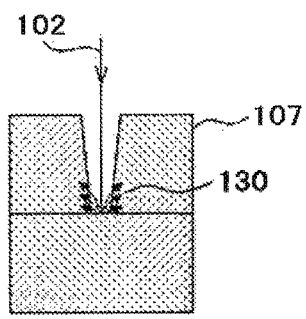
FIG. 2B A cross sectional view of a hole pattern schematically illustrating a state in which backscattered electrons (BSEs) are generated from the bottom of the hole pattern, which are captured by the imaging optical system of a previously existing scanning electron microscope system when a primary electron beam is applied to the hole pattern.
Figure 11B:
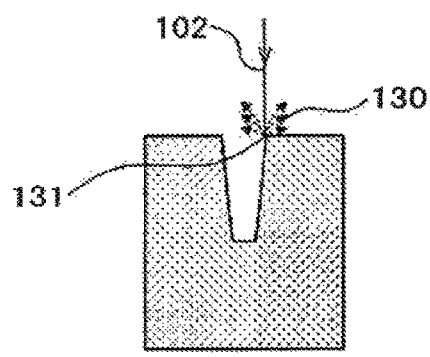
FIG. 11B A cross sectional view schematically illustrating a hole pattern in a state in which secondary electrons are generated from the top edge of the hole pattern when a primary electron beam is applied to the hole pattern.

As illustrated in FIG. 2B, or FIGS. 4C and 4D, secondary electrons (SEs) emitted from the bottom of a hole formed on the sample fail to escape to the hole outer region. However, as illustrated in FIG. 11B, secondary electrons 130 emitted from near a top edge 131 of the hole are detected at the detector 121.

As the schematic diagram 1310 illustrated in FIG. 12A, secondary electrons (130 in FIG. 11B) emitted from near a top edge 1312 of a hole 1311 have a bright peak on the image by the edge effect. Thus, these electrons are suited to the measurement of the top diameter of a hole. As illustrated in FIG. 12B, the detection of peaks 1321 and 1322 of a signal waveform 1320 allows the determination of a top diameter 1323 of the hole.

As illustrated in FIG. 12C, the combination of the first embodiment with the second embodiment and the third embodiment determines a top diameter d1 (1331), a hole depth h (1333), and a bottom diameter d2 (1332) of a hole 133. Thus, it is possible to acquire information necessary to manage the ratio of the top diameter to the bottom diameter of a hole, which is a problem of measurement described at the beginning.

With the use of the imaging optical system 002 illustrated in FIG. 11A, a low angle BSE image from the detector 106 and an SE image from the detector 121 are acquired at the same time. This provides merits below. FIG. 13A is a schematic diagram 1410 of an SE image. FIG. 13B is a schematic diagram 1420 of a BSE image. As a hole 1411 on the schematic diagram 1410 of the SE image in FIG. 13A and a hole 1421 on the schematic diagram 1420 of the BSE image in FIG. 13B, the displacement of the centers of the holes on the SE image and the BSE image suggests that a hole expressed by the holes 1411 and 1421 is not provided perpendicularly.

In the case where the SE image and the BSE image are not acquired at the same time, the positional displacement in acquiring the images fails to be distinguished from the eccentricity of the hole pattern. However, this problem does not arise in the case where the SE image and the BSE image are acquired at the same time. Thus, with the comparison of the same hole pattern between the SE image and the BSE image, the degree of eccentricity of the hole pattern can be determined more accurately.

According to the embodiment, with the combined use of the low angle BSE image and the SE image detected at the same time, the top diameter of a hole can be more accurately measured, as well as information effective for managing the perpendicularity of a hole can be obtained.

Fourth Embodiment

FIG. 14A is the basic configuration of an imaging optical system 003 according to a fourth embodiment of the present invention. The difference from the imaging optical system 001 described in the first embodiment (see FIG. 1) lies in that the imaging optical system 003 is additionally provided with a detector 151 that detects high angle BSEs 150 (BSEs 150 emitted in the direction in which an angle from the surface of the sample 107 is relatively large) emitted from the sample 107 and an image generating unit 152 that generates a high angle BSE image.

As illustrated in FIG. 14B, the detector 151 detects high angle BSEs 130 that have been nearly upwardly emitted from a bottom hole 1503 of a hole 1501 formed on the sample 107, have passed through an opening 1502 of the hole 1501, and then have traveled to the hole outer region. Output signals from the detector 151 having detected the high angle BSEs 130 are inputted to the image generating unit 152 that generates a high angle BSE image. A digital image is generated, and inputted to the operating unit 022. In FIG. 7B, it is described that the high angle BSE image has no sensitivity to the depth of a hole. In other words, the high angle BSE image has information about the intensity of reflected electrons from the bottom of a hole material regardless of the depth of the hole.

Figure 3B:
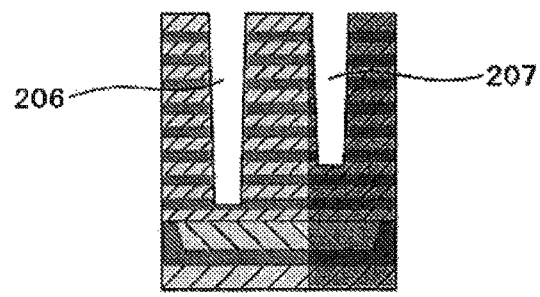
FIG. 3B A cross sectional view of a sample formed with hole patterns in a state in which holes with a high aspect ratio, which are typical measurement targets according to the first embodiment of the present invention, are shallowly and incorrectly formed.
Figure 3C:
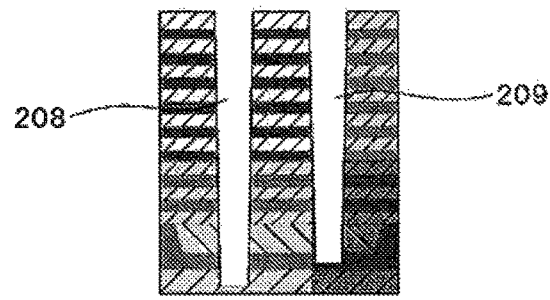
FIG. 3C A cross sectional view of a sample formed with hole patterns in a state in which holes with a high aspect ratio, which are typical measurement targets according to the first embodiment of the present invention, are deeply and incorrectly formed.

As illustrated in FIGS. 3B and 3C, in the case where holes 206 to 209 are not normally formed, the material of the hole bottom is usually unknown. In the case of a low angle BSE image detected at the scintillator 106, the signal amount is also varied depending on changes in the depth of the hole as well as the difference of the material of the hole bottom. Thus, distinguishing between the depth and the material fails. On the other hand, a high angle BSE image detected at the detector 151 has no sensitivity to the depth of a hole. Thus, it is possible to estimate the hole bottom material from the signal strength.

Figure 15:
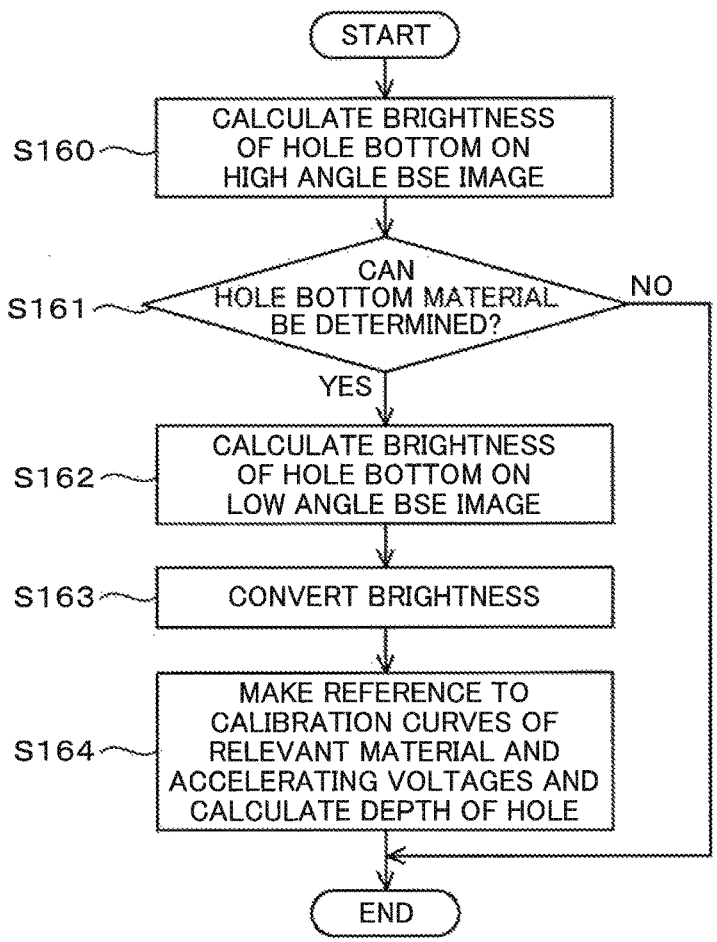
FIG. 15 A flowchart of a dimension measurement algorithm according to the fourth embodiment of the present invention.

FIG. 15 is a process flow of the operating unit 022 in the case where the high angle BSE image is also used. First, the brightness of the hole bottom is calculated from a high angle BSE image inputted from the image generating unit 152 that generates a high angle BSE image (S160). From the brightness, the material of the hole bottom is estimated. Although not illustrated in the drawing, in the process, similarly, it is necessary to provide the step corresponding to the conversion of the brightness in the case of the low angle BSE image (S8032 in FIG. 8). In the case where the hole bottom material fails to be determined, the process is ended because the measurement of the depth of the hole using the low angle BSE image has no meaning. In the case where the determination of the hole bottom material is enabled, the brightness of the hole bottom is calculated using the low angle BSE image inputted from the image generating unit 113 that generates a low angle BSE image (S162). After the brightness is converted (S163), reference is made to the calibration curves for materials and accelerating voltages, and then the depth of the hole is calculated (S164).

As described above, according to the embodiment, the depth of a hole can be measured even in the case where the material of the hole bottom is unknown.

Fifth Embodiment

Figure 16A:
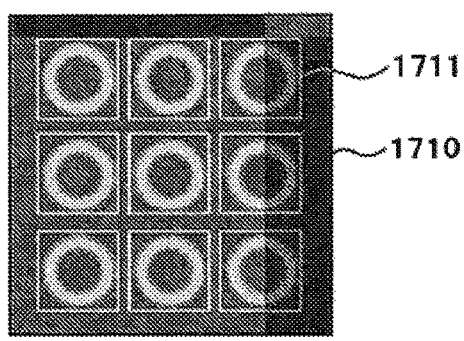
FIG. 16A A diagram of a user interface according to a fifth embodiment of the present invention, illustrating a measurement box for specifying a pattern to be measured.
Figure 16B:
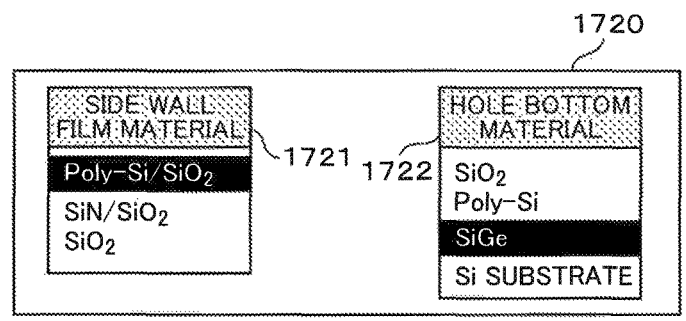
FIG. 16B A diagram of a user interface according to the fifth embodiment of the present invention, illustrating a material specifying box that specifies a side wall film material and a hole bottom material.
Figure 16C:
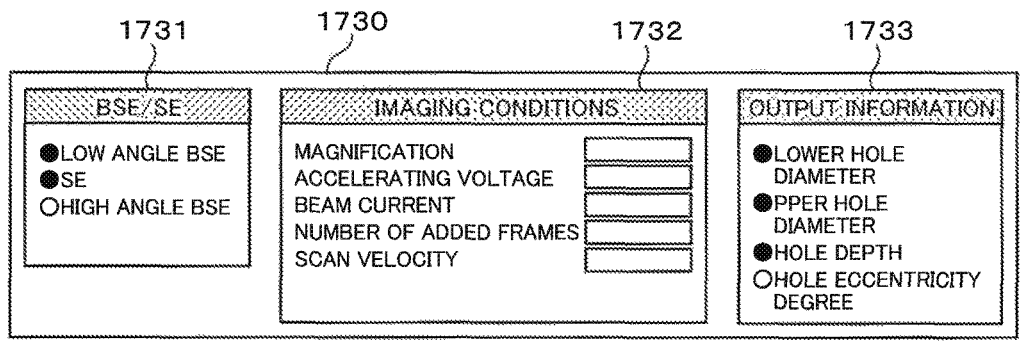
FIG. 16C A diagram of a user interface according to the fifth embodiment of the present invention, illustrating a condition setting box that sets the optical conditions for selecting BSEs and SEs and the output content of an output information display unit.

A fifth embodiment is a user interface for implementing the present invention. In order to automatically perform measurement described in the first to fourth embodiments, it is necessary to generate a recipe that specifies various conditions in advance. In addition to a measurement box 1710 that specifies a pattern 1711 to be measured as illustrated in FIG. 16A, on the screen of the input/output unit 024, the recipe displays a material specifying box 1720 that specifies a side wall film material 1721 and a hole bottom material 1722 illustrated in FIG. 16B and a condition setting box 1730 that sets the optical conditions for selecting BSEs and SEs as illustrated in FIG. 16C and the output content of an output information display unit 1735.

According to the embodiment, it is possible to specify items that need user input for implementing the present invention.

Sixth Embodiment

FIG. 18A is the basic configuration of an imaging optical system according to a sixth embodiment of the present invention. The configurations according to the first to fourth embodiments are mainly targeted for measuring hole patterns. The embodiment is targeted for a groove pattern with a high aspect ratio (180 in FIG. 17). For example, this corresponds to the process of forming the slit of a word line in the 3D-NAND processes. In the embodiment, a detector 180 split in azimuth angle directions to detect low angle BSEs is used in the imaging optical system 004 as the detector 180 to detect low angle BSEs.

In the case where a measurement target is a groove pattern, BSEs emitted in the longitudinal direction of the groove are not penetrating BSEs. Thus, the detector 180 does not detect BSEs emitted in the longitudinal direction, and detects only penetrating BSEs emitted in the transverse direction of the groove. This is a detector 180, which is split in orientation directions, including four detecting devices 180*a* to 180*d* as illustrated in FIG. 18B. Depending on the direction of the groove, the output from which one of the detecting devices in the orientations is selected.

Figure 17:
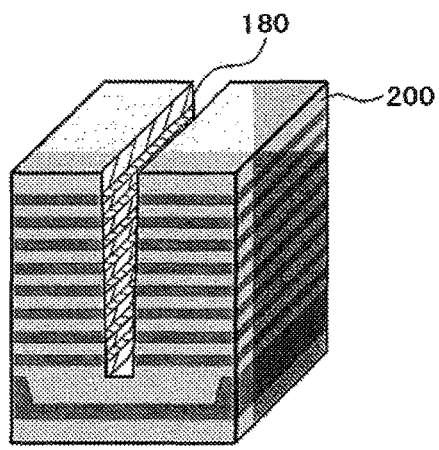
FIG. 17 A perspective view for explaining the cross sectional structure of a groove pattern with a high aspect ratio.

With the use of the imaging optical system 004 as illustrated in FIG. 18A, the depth or groove width of the groove pattern 180 formed on the sample 200 as illustrated in FIG. 17 can be measured, as well as the depth or diameter of the hole pattern as described in the first and the second embodiments can be measured.

According to the embodiment, the detection of penetrating BSEs, which is the present invention, is applicable to the measurement of a groove pattern with a high aspect ratio.

REFERENCE SIGNS LIST 001, 002, 003, 004 Imaging optical system
021 Control unit
022 Operating unit
023 Storage unit
024 Input/output unit
101 Electron gun
102 Primary electron beam
103 Capacitor lens
104 Deflector
105 Objective lens
106 Low angle BSE detecting annular scintillator
108 Stage
110 Low angle BSEs
111 Optical fiber
112 Photomultiplier tube
113 Image generating unit that generates a low angle BSE image
200 Sample
201, 202 Film stack
204 Hole pattern normally formed
205 Stopper film
206, 207 Hole with a short hollow
208, 209 Hole with an excess hollow
120 Secondary electrons
121 Secondary electron detector
122 Image generating unit that generates a secondary electron image
130 Secondary electrons emitted from the bottom of a hole
140 Hole pattern on an SE image
141 Hole pattern on a low angle BSE image
150 High angle BSEs
151 High angle BSE detector
152 Image generating unit that generates a high angle BSE image
185 Groove pattern with a high aspect
180 Low angle BSE detector split in orientation directions

The invention claimed is:

1. A scanning electron microscope system that measures a hole pattern or a groove pattern formed on a substrate, the system comprising:
   a primary electron beam application unit that scans and applies a primary electron beam to a pattern formed on the substrate;
   a backscattered electron detection unit that detects backscattered electrons having penetrated a side wall of the hole pattern or the groove pattern among backscattered electrons emitted from the substrate to which a primary electron beam is applied by the primary electron beam application unit;
   an electron beam image generation unit that generates an electron beam image corresponding to a distribution of intensity of the backscattered electrons detected by the backscattered electron detection unit; and
   an image processing unit that determines a boundary region between a dark region and a bright region, the dark region being present in the bright region on the electron beam image generated by the electron beam image generation unit, and detects the determined boundary region as a location of an edge of the hole pattern or the groove pattern.

2. The scanning electron microscope system according to claim 1,
   wherein the backscattered electron detection unit includes a backscattered electron detector disposed so as to surround an optical path of a primary electron beam applied to the sample for detecting backscattered electrons emitted from the substrate to which the primary electron beam is scanned and applied.

3. The scanning electron microscope system according to claim 1, further comprising:
   a secondary electron detection unit that detects secondary electrons emitted from the substrate; a secondary electron beam image generation unit that generates an electron beam image corresponding to intensity of the secondary electrons detected by the secondary electron detection unit; and a pattern width measurement unit that measures a top diameter of the hole pattern or a width of the groove pattern based on a location of an edge of a bright region on the electron beam image of the secondary electrons, the image being generated by the secondary electron beam image generation unit.

4. The scanning electron microscope system according to claim 1, further comprising:
   a second backscattered electron detection unit that detects backscattered electrons scattered in a direction in which a zenith angle is smaller than an angle of five degrees in backscattered electrons emitted from the substrate; a second electron beam image generation unit that generates an electron beam image corresponding to intensity of the backscattered electrons scattered in the direction in which a zenith angle is smaller than an angle of five degrees, the backscattered electrons being detected by the second backscattered electron detection unit; and a material estimation unit that estimates a material of a bottom of the hole pattern or the groove pattern from brightness of a region corresponding to the bottom of the hole pattern or the groove pattern on the backscattered electron beam image generated by the second electron beam image generation unit.

5. The scanning electron microscope system according to claim 1,
wherein the backscattered electron detection unit that detects backscattered electrons having penetrated the side wall of the hole pattern or the groove pattern includes a detector having a plurality of detection faces for detecting the backscattered electrons in individual orientations.

6. A scanning electron microscope system that measures a hole pattern or a groove pattern formed on a substrate, the system comprising:
a primary electron beam application unit that scans and applies a primary electron beam to a pattern formed on the substrate;
a backscattered electron detection unit that detects backscattered electrons having penetrated a side wall of the hole pattern or the groove pattern among backscattered electrons emitted from the substrate to which a primary electron beam is applied by the primary electron beam application unit;
an electron beam image generation unit that generates an electron beam image corresponding to a distribution of intensity of the backscattered electrons detected by the backscattered electron detection unit; and
a depth estimation unit that determines a boundary region between a dark region and a bright region, the dark region being present in the bright region on the electron beam image generated by the electron beam image generation unit, and estimates a depth of the hole pattern or the groove pattern from information about brightness of the dark region in the determined boundary region.

7. The scanning electron microscope system according to claim 6,
wherein the backscattered electron detection unit includes a backscattered electron detector disposed so as to surround an optical path of a primary electron beam applied to the sample for detecting backscattered electrons emitted from the substrate to which the primary electron beam is scanned and applied.

8. The scanning electron microscope system according to claim 6,
wherein the depth estimation unit makes reference to a calibration curve that correlates a depth of a hole pattern or a groove pattern formed in advance with brightness of an electron beam image and calculates a depth.

9. The scanning electron microscope system according to claim 6, further comprising:
a secondary electron detection unit that detects secondary electrons emitted from the substrate; a secondary electron beam image generation unit that generates an electron beam image corresponding to intensity of the secondary electrons detected by the secondary electron detection unit; and a pattern width measurement unit that measures a top diameter of the hole pattern or a width of the groove pattern based on a location of an edge of a bright region on the electron beam image of the secondary electrons, the image being generated by the secondary electron beam image generation unit.

10. The scanning electron microscope system according to claim 6, further comprising:
a second backscattered electron detection unit that detects backscattered electrons scattered in a direction in which a zenith angle is smaller than an angle of five degrees in backscattered electrons emitted from the substrate; a second electron beam image generation unit that generates an electron beam image corresponding to intensity of the backscattered electrons scattered in the direction in which a zenith angle is smaller than an angle of five degrees, the backscattered electrons being detected by the second backscattered electron detection unit; and a material estimation unit that estimates a material of a bottom of the hole pattern or the groove pattern from brightness of a region corresponding to the bottom of the hole pattern or the groove pattern on the backscattered electron beam image generated by the second electron beam image generation unit.

11. The scanning electron microscope system according to claim 6,
wherein the backscattered electron detection unit that detects backscattered electrons having penetrated the side wall of the hole pattern or the groove pattern includes a detector having a plurality of detection faces for detecting the backscattered electrons in individual orientations.

12. A scanning electron microscope system that measures a hole pattern or a groove pattern formed on a substrate, the system comprising:
a primary electron beam application unit that scans and applies a primary electron beam to a pattern formed on the substrate;
a backscattered electron detection unit that detects backscattered electrons having penetrated a side wall of the hole pattern or the groove pattern among backscattered electrons emitted from the substrate to which a primary electron beam is applied by the primary electron beam application unit;
an electron beam image generation unit that generates an electron beam image corresponding to a distribution of intensity of the backscattered electrons detected by the backscattered electron detection unit;
an image processing unit that determines a boundary region between a dark region and a bright region, the dark region being present in the bright region on the electron beam image generated by the electron beam image generation unit, and detects the determined boundary region as a location of an edge of the hole pattern or the groove pattern; and
a depth estimation unit that determines a boundary region between a dark region and a bright region, the dark region being present in the bright region on the electron beam image generated by the electron beam image generation unit, and estimates a depth of the hole pattern or the groove pattern from information about brightness of the dark region in the determined boundary region.

13. The scanning electron microscope system according to claim 12,
wherein the backscattered electron detection unit includes a backscattered electron detector disposed so as to surround an optical path of a primary electron beam applied to the sample for detecting backscattered electrons emitted from the substrate to which the primary electron beam is scanned and applied.

14. The scanning electron microscope system according to claim 12,
wherein the depth estimation unit makes reference to a calibration curve that correlates a depth of a hole pattern or a groove pattern formed in advance with brightness of an electron beam image and calculates a depth.

15. The scanning electron microscope system according to claim 12, further comprising:
a secondary electron detection unit that detects secondary electrons emitted from the substrate; a secondary electron beam image generation unit that generates an electron beam image corresponding to intensity of the secondary electrons detected by the secondary electron detection unit; and a pattern width measurement unit that measures a top diameter of the hole pattern or a width of the groove pattern based on a location of an edge of a bright region on the electron beam image of the secondary electrons, the image being generated by the secondary electron beam image generation unit.

16. The scanning electron microscope system according to claim 12, further comprising:
a second backscattered electron detection unit that detects backscattered electrons scattered in a direction in which a zenith angle is smaller than an angle of five degrees in backscattered electrons emitted from the substrate; a second electron beam image generation unit that generates an electron beam image corresponding to intensity of the backscattered electrons scattered in the direction in which a zenith angle is smaller than an angle of five degrees, the backscattered electrons being detected by the second backscattered electron detection unit; and a material estimation unit that estimates a material of a bottom of the hole pattern or the groove pattern from brightness of a region corresponding to the bottom of the hole pattern or the groove pattern on the backscattered electron beam image generated by the second electron beam image generation unit.

17. The scanning electron microscope system according to claim 12,
wherein the backscattered electron detection unit that detects backscattered electrons having penetrated the side wall of the hole pattern or the groove pattern includes a detector having a plurality of detection faces for detecting the backscattered electrons in individual orientations.

18. A pattern measurement method for a hole pattern or a groove pattern formed on a substrate using a scanning electron microscope system, the method comprising:
scanning and applying a primary electron beam to a hole pattern or a groove pattern formed on a substrate using an electron microscope;
detecting backscattered electrons having penetrated a side wall of the hole pattern or the groove pattern among backscattered electrons emitted from the substrate to which the primary electron beam is applied;
generating an electron beam image corresponding to a distribution of intensity of the detected backscattered electrons;
determining a boundary region between a dark region and a bright region, the dark region being present in the bright region on the generated electron beam image; and
detecting the determined boundary region as a location of an edge of the hole pattern or the groove pattern, and estimating a depth of the hole pattern or the groove pattern from information about brightness of the dark region in the determined boundary region.

19. The pattern measurement method using a scanning electron microscope system according to claim 18, wherein a primary electron beam having an energy of 30 kilo electron volts or more is applied to the hole pattern or the groove pattern using the electron microscope.

20. An electron microscope that measures a hole pattern or a groove pattern formed on a substrate, the electron microscope comprising:
a primary electron beam application unit that scans and applies a primary electron beam to a pattern formed on the substrate;
a backscattered electron detection unit that detects backscattered electrons having penetrated a side wall of the hole pattern or the groove pattern among backscattered electrons emitted from the substrate to which a primary electron beam is applied by the primary electron beam application unit; and
an electron beam image generation unit that generates an electron beam image corresponding to a distribution of intensity of the backscattered electrons detected by the backscattered electron detection unit.

21. The scanning electron microscope according to claim 20,
wherein the backscattered electron detection unit includes a backscattered electron detector disposed so as to surround an optical path of a primary electron beam applied to the sample for detecting backscattered electrons emitted from the substrate to which the primary electron beam is scanned and applied.

22. The scanning electron microscope according to claim 20,
wherein the backscattered electron detection unit detects backscattered electrons having penetrated the side wall of the hole pattern or the groove pattern, the backscattered electrons being scattered in a direction in which a zenith angle is five degrees or more.

23. The scanning electron microscope according to claim 20, further comprising:
a secondary electron detection unit that detects secondary electrons emitted from the substrate; and a secondary electron beam image generation unit that generates an electron beam image corresponding to intensity of the secondary electrons detected by the secondary electron detection unit.

24. The scanning electron microscope according to claim 20, further comprising:
a second backscattered electron detection unit that detects backscattered electrons scattered in a direction in which a zenith angle is smaller than an angle of five degrees in backscattered electrons emitted from the substrate; and a second electron beam image generation unit that generates an electron beam image corresponding to intensity of the backscattered electrons scattered in the direction in which a zenith angle is smaller than an angle of five degrees, the backscattered electrons being detected by the second backscattered electron detection unit.

25. The scanning electron microscope according to claim 20,
wherein the backscattered electron detection unit that detects backscattered electrons having penetrated the side wall of the hole pattern or the groove pattern includes a detector having a plurality of detection faces for detecting the backscattered electrons in individual orientations.

* * * * *